(12) United States Patent
Durandeau et al.

(10) Patent No.: US 7,976,909 B2
(45) Date of Patent: Jul. 12, 2011

(54) METHOD FOR DEPOSITION OF TITANIUM OXIDE BY A PLASMA SOURCE

(75) Inventors: Anne Durandeau, Paris (FR); Maxime Duran, Paris (FR); Corinne Victor, Saint Leu la Foret (FR)

(73) Assignee: Saint-Gobain Glass France, Courbevoie (FR)

( * ) Notice: Subject to any disclaimer, the term of this patent is extended or adjusted under 35 U.S.C. 154(b) by 1101 days.

(21) Appl. No.: 10/562,868

(22) PCT Filed: Jun. 30, 2004

(86) PCT No.: PCT/FR2004/001673
§ 371 (c)(1),
(2), (4) Date: Jan. 4, 2007

(87) PCT Pub. No.: WO2005/012593
PCT Pub. Date: Feb. 10, 2005

(65) Prior Publication Data
US 2007/0092734 A1      Apr. 26, 2007

(30) Foreign Application Priority Data

Jul. 1, 2003   (FR) .................................... 03 07948

(51) Int. Cl.
*H05H 1/24* (2006.01)
*C23C 16/00* (2006.01)

(52) U.S. Cl. ...................... 427/576; 427/569; 427/248.1

(58) Field of Classification Search .................. 427/576, 427/569, 248.1
See application file for complete search history.

(56) References Cited

U.S. PATENT DOCUMENTS

| 6,027,766 | A   |   | 2/2000  | Greenberg et al. |
|-----------|-----|---|---------|------------------|
| 6,103,363 | A   | * | 8/2000  | Boire et al. .................. 428/325 |
| 6,290,180 | B1  | * | 9/2001  | Browall et al. ............. 244/171.7 |
| 6,890,656 | B2  | * | 5/2005  | Iacovangelo et al. ......... 428/412 |
| 2002/0041967 | A1 |  | 4/2002 | Nakamura et al. |
| 2004/0202890 | A1 | * | 10/2004 | Kutilek et al. ............... 428/689 |

FOREIGN PATENT DOCUMENTS

| FR | 2 738 813 | 3/1997 |
| JP | 8 253322  | 10/1996 |
| JP | 8 313705  | 11/1996 |
| JP | 2001 046884 | 2/2001 |
| JP | 2001 335343 | 12/2001 |
| JP | 2002 119864 | 4/2002 |
| WO | 00/75087  | 12/2000 |
| WO | 2004/061155 | 7/2004 |

OTHER PUBLICATIONS

Jhin J. et al: Effect of Plasma Pretreatment of Soda-Lime Glass on the Preferred Orientation of TI02 & IEEE Int Conf Plasma Sci; IEEE International Conference on Plasama Science, p. 290. 2003.

Badawy W. A: "Preparation and Characterization of TI02/SB Thin Films for Solar Energy Applications" Solar Energy Materials and Solar Cells, Elsevier Science Publishers, vol. 28, No. 4, pp. 293-303, 1993.

* cited by examiner

*Primary Examiner* — Timothy H Meeks
*Assistant Examiner* — Kelly M Gambetta
(74) *Attorney, Agent, or Firm* — Oblon, Spivak, McClelland, Maier & Neustadt, L.L.P.

(57) ABSTRACT

Process for depositing, on a substrate, a coating based on titanium oxide, which is characterized in that the coating with photocatalytic properties is deposited by chemical vapor deposition, especially from a gas mixture comprising at least one organometallic precursor and/or a metal halide of said metal oxide, the deposition being enhanced by a plasma source.

7 Claims, No Drawings

METHOD FOR DEPOSITION OF TITANIUM OXIDE BY A PLASMA SOURCE

CROSS-REFERENCE TO RELATED APPLICATIONS

The present application is a 371 application PCT/FR2004/001673 filed on Jun. 30, 2004.

The present invention relates to a process for depositing a coating based on titanium oxide having photocatalytic properties on a substrate, especially a transparent substrate. It also relates to the substrate thus obtained.

Substrates based on glass, ceramic or glass-ceramic substrates, more particularly glass, especially transparent, substrates, which are provided with coatings having photocatalytic properties, in order to manufacture glazing or various applications, such as utilitarian glazing and glazing for vehicles or buildings, are known.

The photocatalytic properties conferred on the substrate because of the titanium-oxide-based coating give the latter an antisoiling function. More particularly, the substrate retains appearance and surface properties over time that make it possible in particular to space out cleaning operations and/or improve visibility, by being able to remove the soiling as and when it becomes deposited on the surface of the substrate, especially soiling of organic origin, such as fingerprints or volatile organic substances present in the atmosphere, or even soiling of the fogging type.

It will be recalled that this cleaning results from the fact that certain semiconductor materials, based on a metal oxide, such as for example titanium oxide, are capable, under the effect of radiation of suitable wavelength (in the visible and/or in the ultraviolet), of initiating radical reactions that cause organic substances to oxidize: in general, these materials are referred to as being "photocatalytic" or "photoreactive".

Among the processes commonly used to deposit such a coating, there are many known techniques, namely:
  decomposition of metal oxide precursors, such as for example titanium (pyrolysis techniques: liquid pyrolysis, powder pyrolysis, CVD (Chemical Vapor Deposition), sol-gel techniques: immersed or dipping, cell-coating, etc.);
  vacuum technique (sputtering, whether reactive or not).

The first technique, namely pyrolitic decomposition, which is inexpensive, offers satisfactory results but suffers from a lack of flexibility. This is because the decomposition of the precursors takes place directly on the float glass line, and any modification as regards the nature of the substrate (composition or property) on which the coating is deposited necessarily means that the float-glass raw-material charging conditions have to be slowly adapted. Moreover, it may be noted, as regards drawbacks of this deposition technique, that there is a certain difficulty in controlling the surface temperatures and the temperatures of the precursor injection means (nozzles), the high temperatures being one of the most fundamental parameters for obtaining a titanium oxide coating possessing optimum photocatalytic properties. In addition, because of the heat treatment, the deposition can be carried out only on substrates that are not very sensitive to temperature (for example those made of plastic).

The second technique mentioned above, namely vacuum deposition (for example using a magnetron line), necessary requires a heat treatment phase carried out on the titanium oxide coating vacuum-deposited beforehand, so as to obtain a suitable crystallographic phase. This heating is difficult to carry out directly within the magnetron, which is under vacuum, and it is therefore necessary to carry out a further operation outside the deposition chamber. This is because, in order for said coating to possess photocatalytic properties, it is necessary for the titanium oxide to be crystallized in anatase form, in rutile form or in the form of a mixture of anatase, rutile and brookite, with a degree of crystallization of at least 25%, especially about 30 to 80%, especially close to the surface (the property being more a surface property). (The term "degree of crystallization" is understood to mean the amount by weight of crystallized $TiO_2$, relative to the total amount by weight of $TiO_2$ in the coating).

The object of the invention is therefore to develop a process for depositing photocatalytic coatings on a substrate, which exhibit a pronounced "antisoiling" effect with respect to the substrate and can be manufactured in an industrial manner, which does not have the drawbacks of the abovementioned techniques.

To their great surprise, the inventors have discovered that it is possible to use the PECVD (Plasma-Enhanced Chemical Vapor Deposition) technique to deposit a photocatalytic coating on a glass or non-glass substrate.

This particular technique is known for depositing titanium oxide for waveguide applications (U.S. Pat. No. 5,295,220), or for fission trapping applications (FR 2 695 507).

The subject of the invention is therefore a process for depositing, on a substrate, a coating based on semiconductor materials based on metal oxides, especially titanium oxide, which are capable, under the effect of radiation of suitable wavelength, of initiating radical reactions causing the oxidation of organic substances so as to confer photocatalytic properties on said coating, characterized in that the coating with photocatalytic properties is deposited by chemical vapor deposition, especially from a gas mixture comprising at least one organometallic precursor and/or a metal halide of said metal oxide, the deposition being enhanced by a plasma source.

Thanks to these arrangements and especially to the use of a plasma source to dissociate the metal oxide precursor, it is possible to obtain a photocatalytic coating that does not necessarily require a heat treatment at high temperature (above 300-350° C.) for revealing the desired properties, during or subsequent to the deposition, and which is also very flexible, the optimum deposition conditions no longer being dependent on the presence of a nearby (float) heat source.

In preferred embodiments of the invention, it is possible optionally to also make use of one or more of the following arrangements:
  at least one carrier gas or a mixture of carrier gases, chosen from air, nitrogen, helium and argon, is injected parallel to the mixture containing the precursor;
  an oxidizing agent or a mixture of oxidizing agents is incorporated into the gas mixture;
  a reducing agent or a mixture of reducing agents is incorporated into the gas mixture;
  the reaction and deposition phase takes place at reduced pressure;
  the reaction and deposition phase takes place at atmospheric pressure;
  at least one sublayer is deposited, prior to the deposition of the coating with photocatalytic properties, making it possible to impart another functionality to said coating with photocatalytic properties and/or to reinforce said properties of said coating;
  incorporated into the gas mixture comprising at least the organometallic precursor and/or a metal halide of said metal oxide is at least one other type of mineral material, especially in the form of an amorphous or partially crystallized oxide, for example a silicon oxide (or mixture of oxides), titanium oxide, tin oxide, zirconium oxide, vanadium oxide, antimony oxide, zinc oxide, tungsten oxide, cobalt oxide, nickel oxide or aluminum oxide, these oxides optionally being mixed or doped, the coating with photocatalytic properties is deposited on the substrate within the actual plasma discharge; and the coating with photocatalytic properties is deposited on the substrate outside the plasma discharge.

According to another aspect of the invention, the subject of the latter is also a substrate obtained using the abovementioned process, and also variants thereof.

This substrate based on glass, ceramic, glass-ceramic or plastic, provided on at least part of at least one of its faces with a coating with photocatalytic properties, comprising at least partially crystallized titanium oxide, is characterized in that the crystallized titanium oxide is in anatase form, in rutile form, in brookite form or in the form of a mixture of anatase, rutile and brookite.

In preferred embodiments, it is possible optionally to also make use of one or more of the following provisions:

the crystallized titanium oxide is in the form of crystallites with a mean size of between 0.5 and 60 nm, preferably 1 to 50 nm;

the coating also includes a mineral material, especially in the form of an amorphous or partially crystallized oxide or mixture of oxides, of the silicon oxide, titanium oxide, tin oxide, zirconium oxide, aluminum oxide, vanadium oxide, antimony oxide, zinc oxide, tungsten oxide, cobalt oxide or nickel oxide type, it being possible for these oxides to be mixed oxides or doped oxides;

the coating includes additives capable of extending the photcatalytic effect due to titanium oxide, especially by increasing the absorption band of the coating and/or by increasing the number of charge carriers by doping the crystal lattice of the oxide or by surface doping of the coating and/or by increasing the efficiency and rate of the photocatalytic reactions by covering at least part of the coating with a catalyst;

the crystal lattice of the titanium oxide is doped, especially by at least one of the metallic or nonmetallic elements;

the thickness of the coating is between 5 nm and 1 micron, preferably 5 to 100 nm;

the photocatalytic activity of the coating is at least $5 \times 10^{-3}$ $cm^{-1}$ $min^{-1}$ measured by means of the TAS test;

the rms roughness of the photocatalytic coating is between 2 and 20 nm, especially between 5 and 20 nm;

the light reflection of the photocatalytic coating is less than 30%, preferably less than or equal to 20%, with a neutral color;

the absorption of the photocatalytic coating is less than 10%, preferably less than 5%;

at least one thin film having an antistatic, thermal or optical function, or forming a barrier to the migration of alkali metals coming from the substrate, is placed beneath the coating with photocatalytic properties;

the thin film having an antistatic function, possibly with controlled polarization, and/or having a thermal and/or optical function is based on a conductive material of the metal type or of the doped metal oxide type, such as ITO, F:$SnO_2$, Sb:$SnO_2$, In:ZnO, F:ZnO, Al:ZnO, or Sn:ZnO, or a metal oxide substoichiometric in oxygen, such as $SnO_{2-x}$ or $ZnO_{2-x}$, where x<2;

the thin film having an optical function is based on an oxide or a mixture of oxides, the refractive index of which is intermediate between that of the coating and that of the substrate, especially that (or those) chosen from the following oxides: $Al_2O_3$, $SnO_2$, and $In_2O_3$, or based on silicon oxycarbide or silicon oxynitride, or optionally based on a mixture of a material of high refractive index with a material of low refractive index, ($Al_2O_3$/$TiO_2$, $Al_2O_3$/$SiO_2$, $Al_2O_3$/$SnO_2$, $SnO_2$/$TiO_2$, etc.);

the thin film or multiple film having an alkali-metal barrier function is based for example on a silicon oxide, nitride, oxynitride or oxycarbide, F:$Al_2O_3$ or F:$SnO_2$, aluminum nitride or silicon nitride;

the substrate is a transparent, flat or curved, substrate.

the substrate is a glass substrate; and the substrate is a substrate based on a polymer, especially PMMA, polycarbonate or PEN.

According to another aspect of the invention, the subject of the latter is an "antisoiling and/or antifogging", monolithic, multiple (double) or laminated glazing assembly incorporating the substrate as described above for the manufacture of glazing that is "self-cleaning", antifogging and/or antisoiling, as regards organic and/or mineral soiling, especially building windows of the double-glazing type, vehicle windows of the windshield, rear window or side-window type for automobiles, trains and aircraft, or utilitarian glazing, such as glass for an aquarium, for shop windows, for a greenhouse, for interior furnishing, for urban furniture, or mirrors, television screens, or glazing with electrically controlled variable absorption etc.

Other features and advantages of the invention will become apparent over the course of the following description of one of its embodiments, this being given by way of nonlimiting example.

According to a preferred embodiment, it is intended to deposit, on a transparent substrate based on glass, ceramic or glass-ceramic, especially glass, or a polymer-based substrate, provided on at least part of at least one of its faces with a coating having photocatalytic properties comprising, for example, at least partially crystallized titanium oxide. The titanium oxide is preferably crystallized "in situ", while the coating is being formed on the substrate. According to the invention, at least one thin film forming a barrier to the migration of alkali metals coming from the substrate is also placed beneath this coating.

Titanium oxide is in fact one of the semiconductors that, when exposed to the action of light in the visible or ultraviolet range, degrade organic substances deposited on their surface. The choice of titanium oxide for the manufacture of glazing with an "antisoiling" effect is therefore particularly indicated, the more so as this oxide exhibits good mechanical and chemical resistance. To be effective for a long time, it is of course important for the coating to retain its integrity, even when directly exposed to many forms of attack, especially when the glazing is being mounted on site (for a building) or on a production line (for a vehicle), which involves being repeatedly manipulated by mechanical or pneumatic gripping means, and also once the glazing is in place, with the risk of abrasion (by a windshield wiper, or abrasive cloth) or the risk of contact with aggressive chemicals (atmospheric pollutants of the $SO_2$ type, cleaning products, etc.).

It has also been observed, especially in the case of crystallization in anatase form, that the orientation of the $TiO_2$ crystals growing on the substrate has an influence on the photocatalytic performance properties of the oxide—a (110) orientation, which clearly favors photocatalysis, is preferred.

The coating is produced so that the crystallized titanium oxide that it contains is, at least close to the surface, in the form of "crystallites", that is to say single crystals, having a mean size of between 0.5 and 100 nm, preferably 1 to 50 nm, since it is in this size range that titanium oxide seems to have the optimum photocatalytic effect, probably because crystallites of this size develop a large active surface area.

The coating may also include, apart from the crystallized titanium oxide, at least one other type of mineral material, especially in the form of an amorphous or partially crystalized oxide, for example a silicon oxide (or oxide mixture), titanium oxide, tin oxide, zirconium oxide or aluminum oxide. This mineral material may also contribute the photocatalytic effect of the crystallized titanium oxide, by itself having a certain photocatalytic effect, albeit slight compared with that of crystallized $TiO_2$, which is the case for amorphous titanium oxide or tin oxide.

A "mixed" oxide film, which thus combines at least partially crystallized titanium oxide with at least one other oxide, may be beneficial from the optical standpoint, more particularly if the other oxide or oxides are chosen to have an index lower than that of $TiO_2$—by lowering the "overall" refractive index, it is possible to vary the light reflection of the substrate provided with the coating, especially to lower this reflection. This is the case if, for example, a $TiO_2/Al_2O_3$ film, one way of obtaining which is described in patent EP-0 465 309, or a $TiO_2/SiO_2$ film is chosen. However, it is necessary, of course, for the coating to have a sufficient $TiO_2$ content to retain an appreciable photocatalytic activity and for the $TiO_2$ to remain crystallized. Thus, it is considered preferable for the coating to contain at least 40% by weight, especially at least 50% by weight, of $TiO_2$ relative to the total weight of oxide(s) in the coating.

To increase the photocatalytic effect of the titanium oxide of the coating according to the invention, it is firstly possible to increase the absorption band of the coating by incorporating other elements into the coating, especially metallic elements based on optionally doped cadmium, tin, tungsten, zinc, cerium or zirconium, and nonmetallic elements.

The number of charge carriers may also be increased by doping the titanium oxide crystal lattice, by inserting at least one of the following metallic elements into it: niobium, tantalum, iron, bismuth, cobalt, nickel, copper, ruthenium, cerium, molybdenum, etc., or nonmetallic elements (nitrogen, carbon, fluorine).

Very surprisingly, the coating has in fact not one property but two, when it is exposed to suitable radiation, such as in the visible and/or ultraviolet range, like solar radiation. As already seen, the presence of photocatalytic titanium oxide is conducive to the progressive disappearance of any soiling of organic origin, as and when it builds up, by causing it to degrade by a radical oxidation process. Any mineral soiling is not degraded by this process. It therefore remains on the surface and, apart from certain crystallized forms, it can be partly removed easily, since it no longer has any reason to adhere to the surface, the adhesive organic agents being degraded by photocatalysis.

However, the permanently self-cleaning coating of the invention also preferably has an external surface exhibiting pronounced hydrophilicity and/or oleophilicity, which causes three highly advantageous effects:

hydrophilicity allows perfect wetting of the water that may be deposited on the coating. When water condenses, it does so not as a deposit of water droplets in the form of fog impeding visibility, but in fact as a thin continuous film of water that forms on the surface of the coating and is quite transparent. This "antifogging" effect is especially demonstrated by a measured water contact angle of less than 5° after exposure to light; and after water, especially rain, has run over a surface not treated with a photocatalytic film, many drops of rain water remain attached to the surface and, once they have evaporated, they leave unattractive and annoying traces, mainly of mineral origin. This is because a surface exposed to the ambient air rapidly becomes covered with a film of soiling that limits its ability to be wetted by water. Such soiling is followed by other soiling, especially of the mineral (crystallized, etc.) type supplied by the atmosphere in which the glazing is immersed. In the case of a photoreactive surface, this mineral soiling is not directly degraded by photocatalysis. In fact, it is very largely removed thanks to the hydrophilicity induced by the photocatalytic activity. This hydrophilicity causes the raindrops to be perfectly spread out. Any trace of evaporation is therefore no longer present. In addition, any other mineral soiling present on the surface is washed off, or dissolved in the case of crystallization, by the water film and is therefore largely removed. What is obtained is a "mineral antisoiling" effect induced in particular by rain; and together with hydrophilicity, the coating may also exhibit oleophilicity, allowing the "wetting" of any organic soiling which, as in the case of water, then tends to be deposited on the coating in the form of a continuous film less visible than highly localized "stains". What is thus obtained is an "organic antisoiling" effect that takes place in two stages: as soon as the soiling is deposited on the coating, it already becomes barely visible; thereafter it progressively disappears by photocatalytically induced radical degradation.

The coating may be chosen to have a relatively smooth surface but a certain roughness may be desirable:

it allows a higher photocatalytically active surface area to develop and therefore increases the photocatalytic activity;

roughness has a direct influence on wetting since it enhances the wetting properties. A smooth hydrophilic surface will be even more hydrophilic once it has been roughened. The term "roughness" should be understood here to mean both the surface roughness and the roughness induced by porosity in a layer or sublayer within at least part of its thickness.

The above effects will be more pronounced the more porous and rough the coating—hence a superhydrophilic effect on rough photoreactive surfaces. However, if too pronounced, the roughness may be detrimental by being conducive to soiling incrustation and accumulation and/or by an optically unacceptable level of haze appearing.

It has thus proved to be beneficial to tailor the way in which $TiO_2$-coatings are deposited so that they have a roughness of about 2 to 20 nm, preferably 5 to 15 nm, this roughness being determined by atomic force microscopy, by measuring the root mean square (rms) deviation over a surface 1 micron square. With such a roughness, the coatings are hydrophilic, with a water contact angle that may be as low as 1°. It has also been found to be advantageous to promote a certain degree of porosity within the thickness of the coating. Thus, if the coating consists only of $TiO_2$, it preferably has a porosity of around 65 to 99%, especially 70 to 90%, the porosity being defined here indirectly by the percentage of the theoretical density of $TiO_2$, which is about 3.8.

The thickness of the coating according to the invention can vary—it is preferably between 5 nm and 1 micron, preferably between 5 and 100 nm, especially between 10 and 80 nm, or between 15 and 50 nm. In fact, the choice of thickness may depend on various parameters, especially on the intended application of the glazing-type substrate, or on the size of the $TiO_2$ crystallites in the coating, or on the presence of a high alkali metal content in the substrate.

An "antireflection" thin-film multilayer in which thin films of high and low indices alternate may also be envisioned, the coating according to the invention constituting the last film of the multilayer. In this case, it is preferable for the coating to have a relatively low refractive index, which is the case when it consists of a mixed titanium silicon oxide.

The film with an antistatic function and/or thermal (heating, by providing it with current leads, low-emissivity, solar-protection, etc.) function may especially be chosen to be based on a conductive material of the metal type, such as silver, or of the doped metal oxide type, such as tin-doped indium oxide ITO, tin oxide doped with a halogen of the fluorine type, $F:SnO_2$, or with antimony, $Sb:SnO_2$, or indium-doped zinc oxide In:ZnO, fluorine-doped zinc oxide F:ZnO, aluminum-doped zinc oxide Al:ZnO or tin-doped zinc oxide Sn:ZnO. It may also be a metal oxide substoichiometric in oxygen, such as $SnO_{2-x}$ or $ZnO_{2x}$, where x<2.

The film with an antistatic function preferably has a surface resistance value of 20 to 1000 ohms/□. It may also be provided with current leads so as to polarize it (supply voltages for example of between 5 and 100 V). This controlled polarization makes it possible in particular to combat the deposition of dust particles with a size of the order of one millimeter that are liable to be deposited on the coating, especially dry dust particles that adhere by an electrostatic effect. By suddenly reversing the polarization of the film, this dust is "ejected".

The thin film having an optical function may be chosen so as to reduce the light reflection and/or make the color of the substrate in reflection more neutral. In this case, it preferably has a refractive index intermediate between that of the coating and that of the substrate, and an appropriate optical thickness, and it may consist of an oxide or of a mixture of oxides of the aluminum oxide $Al_2O_3$, tin oxide $SnO_2$, indium oxide $In_2O_3$, silicon oxycarbide or silicon oxynitride type. To obtain maximum attenuation of the color in reflection, it is preferable for this thin film to have a refractive index close to the square root of the product of the squares of the refractive indices of the two materials that flank it, that is to say the substrate and the coating according to the invention. At the same time, it is advantageous to choose its optical thickness (i.e. its geometrical thickness multiplied by its refractive index) close to $\lambda/4$, $\lambda$ being approximately the mean wavelength in the visible, especially about 500 to 550 nm.

The thin film with an alkali-metal barrier function may be especially chosen to be based on a silicon oxide, nitride, oxynitride or oxycarbide, on an aluminum oxide containing fluorine, $F:Al_2O_3$, or on aluminum nitride, or else based on $SnO_2$. In fact, this has proved to be useful when the substrate is made of glass, since the migration of sodium ions into the coating according to the invention may, under certain conditions, impair its photocatalytic properties.

The nature of the substrate or of the sublayer also has an additional benefit—it promotes the crystallization of the photocatalytic film that is deposited, especially in the case of plasma-enhanced CVD deposition, preferably at reduced pressure, or even more preferably at atmospheric pressure by APPECVD (atmospheric-pressure plasma-enhanced chemical vapor deposition).

All these optional thin films may be deposited, in a known manner, by vacuum techniques of the sputtering type or by other techniques of the thermal decomposition type, such as pyrolysis in the solid, liquid or vapor phase. Each of the aforementioned films may combine several functions, but it is also possible to superpose them.

The subject of the invention is also "antisoiling" (whether the soiling be organic and/or mineral) and/or "antifogging" glazing assemblies, whether the glazing be monolithic, insulating multiple glazing of the double-glazing type or laminated, which glazing assemblies incorporate the substrates described above.

The invention therefore relates to the manufacture of glass, ceramic or glass-ceramic products, and most particularly to the manufacture of "self-cleaning" glazing assemblies. These may advantageously be glazing for buildings, such as double-glazing (the coating may then be placed on the "outside" and/or on the "inside", that is to say on face 1 and/or on face 4).

This proves to be particularly beneficial in the case of windows that are not very accessible for being cleaned and/or have to be cleaned very frequently, such as roof windows, airport windows, etc. It may also be glazing for vehicle windows in which the retention of visibility is an essential safety criterion. This coating may thus be placed on car windshields, side windows or rear windows, especially on that face of the window that is turned toward the inside of the passenger compartment. This coating can therefore prevent the formation of fogging and/or eliminate traces of soiling of the type comprising fingerprints, nicotine or organic material of the volatile plasticizer type "released" by the plastic with which the inside of the passenger compartment is furnished, especially the plastic of the fascia (such release sometimes being known as fogging).

Other vehicles, such as aircraft or trains, may also benefit from the use of glazing provided with the coating of the invention.

Many other applications are possible, especially for aquarium glass, shop windows, greenhouses and porches, and glass used for interior furnishing or urban furniture, but also mirrors, television screens, in the field of spectacle making or any architectural material of the curtain walling, cladding or roofing type, such as tiles.

The invention thus makes it possible to functionalize these known products, by conferring on them anti-ultraviolet, anti-soiling, bactericidal, antireflection, antistatic, antimicroorganism, etc. properties.

Another advantageous application of the coating according to the invention consists in combining it with glazing having electrically controlled variable absorption of the type comprising electrochromic or photovoltaic glazing, liquid-crystal glazing, possibly with a dichroic dye, glazing with a system of suspended particles, viologen-based glazing, etc. Since all such glazing generally consists of a plurality of transparent substrates between which the "active" elements are placed, it may then be advantageous to place the coating on the external face of at least one of these substrates.

In particular in the case of electrochromic glazing, when the latter is in the colored state its absorption results in a certain amount of surface heating, which consequently is liable to accelerate the photocatalytic decomposition of the carbonaceous substances deposited on the coating according to the invention. For more details about the structure of electrochromic glazing, the reader may advantageously refer to patent application EP-A-0 575 207 that describes electrochromic laminated double glazing, it being possible for the coating according to the invention to be preferably placed on face 1.

This metal oxide coating is therefore produced using the APPECVD technique, consisting of chemical vapor deposition using in particular a gas mixture comprising at least one organometallic precursor and/or a metal halide of said metal oxide (titanium oxide for example in our case), the deposition being enhanced by a plasma source.

The photocatalytic semiconductor material chosen is titanium oxide. There are other such materials that can be used (the reader may refer to the Applicant's patent FR 2 738 813). The semiconductor material may be doped (with N, F, Pt, Pd, metals, etc.) in order to improve its photocatalytic performance or to modify the optical gap and thus be tailored to various wavelengths (UV, visible) of the solar spectrum.

The gas mixture used incorporates an organometallic precursor and/or a metal halide. In the case of titanium oxide, mention may be made of $TiCl_4$, TiPT, Ti ethoxide (butoxide, etc.), Ti diisopropoxide bis(acetylacetonate) and titanium (III) tris(2,2,6,6-tetramethyl-3,5-heptanedionate).

This gas mixture may also include at least one oxidizing agent or mixture of oxidizing agents (air, $O_2$, $CO_2$, $N_2O$, an organic compound such as alcohol, ester, etc.) or at least one reducing agent or mixture of reducing agents ($H_2$, hydrocarbons, etc.) and the carrier gas used is air, nitrogen, helium or argon, or a mixture of these gases. Preferably, it will mainly consist of helium and/or nitrogen and/or argon.

As regards the dopants or mixed dopants, the same ranges of precursors (organometallic compounds/halides) used for the metals may be used. In the case of fluorine, it is possible to use, for example trifluoroacetic acid (TFA), HF, $NF_3$, etc. In the case of nitrogen, it is possible to use $NH_3$ or amines (primary, secondary or tertiary). It is also possible to use precursors containing both titanium and the dopant (for example, tetrakis(diethylamino)titanium, tetrakis(dimethylamino)titanium or tetrachlorodiaminotitanium, etc.)

The reactive gas mixture is then dissociated by a plasma source, either directly within the plasma or indirectly (transferred-arc or blown-arc plasma). The metal oxide having photocatalytic properties is deposited continuously and uniformly, at least over part of at least one of the faces of the substrate, the substrate and the deposition zone incorporating the plasma source undergoing relative displacement.

It may also be advantageous to deposit the coating not in a single step, but in at least two successive steps. This appears to promote crystallization of the titanium oxide through the entire thickness of the coating when this is chosen to be relatively thick.

Likewise, it may be advantageous to subject the coating having photocatalytic properties to a postdeposition heat treatment or a plasma treatment, once the $TiO_2$ has formed, so as to improve its degree of crystallization. The treatment temperature chosen may furthermore allow the degree of crystallization and the crystalline nature—anatase and/or rutile—of the oxide to be better controlled.

The deposition process of the invention is advantageous since the plasma source may provide enough thermal energy (without having to heat the substrate) to obtain the desired crystallographic properties of the metal oxide deposited substantially below 300° C., in the case of a glass substrate, and substantially below 130° C. in the case of a plastic (for example PMMA, polycarbonate, or PEN) substrate. In this case, a barrier layer will be interposed between the substrate and the film having photocatalytic properties.

However, in the case of a soda-lime glass substrate, many and prolonged annealing treatments may attenuate the photocatalytic activity because of excessive migration of alkali metals from the substrate into the photoreactive film. The use of a barrier layer between the substrate, if it is made of standard glass, and the coating, or the choice of a substrate made of glass of suitable composition, or else the choice of a soda-lime glass whose surface has been dealkalized, circumvent this risk.

According to a variant of the invention, the coating includes additives capable of extending the photocatalytic effect due to the titanium oxide, by preventing the recombination of the charge carriers in the material.

As an example, a clear, silica-soda-lime, transparent glass substrate 4 mm in thickness was used. It goes without saying that the invention is not limited to this specific type of glass. Furthermore, the glass does not need to be flat, but may be curved.

According to a first embodiment, a $TiO_2$ film obtained from $TiCl_4$ was deposited by a homogeneous discharge operating at atmospheric pressure.

The thin $TiO_2$ film was deposited on a clean glass substrate heated to a temperature of 260° C. The gas mixture that was introduced consisted of helium (He) and oxygen ($O_2$). The respective flow rates of these gases were 14 slpm and 1 sccm. The organometallic precursor, namely titanium tetrachloride ($TiCl_4$), was poured into a 0.5-liter bubbler. This bubbler was heated to 10° C. and a carrier gas (He) was injected into the bubbler with a flow rate of 140 sccm in order to transport the organometallic vapors. At equilibrium, the total pressure in the reactor was maintained at 1013 mbar±50 mbar. The electrodes, covered with an alumina dielectric barrier (0.5 mm±0.1 mm), were 5 mm apart and were supplied with a 1.1 volt rms sinusoidal AC voltage with a frequency of 25 kHz. Under these conditions, a uniform $TiO_2$ coating was deposited.

Under the abovementioned deposition conditions, a thin $TiO_2$ film 220 nm in thickness was obtained. This film possessed photocatalytic activity.

The TAS test (accurate to within 10%) gave a K of $12 \times 10^{-3}$ $cm^{-1} \cdot min^{-1}$ with a 50% peak air reduction after one hour. This test is described for example in application WO 01/32578.

Raman spectroscopy analysis showed that the $TiO_2$ crystallized in anatase form.

According to a second illustrative example, a $TiO_2$ film obtained from TipT was deposited by a homogeneous discharge operating at atmospheric pressure.

The thin $TiO_2$ film was deposited on a clean glass substrate heated to a temperature of 235° C. The gas mixture introduced consisted of helium (He) and oxygen ($O_2$). The respective flow rates of these gases were 11 slpm and 20 sccm. The organometallic precursor—TipT (titanium tetraisopropoxide)—was poured into a 0.5-liter bubbler. This bubbler was heated to 50° C. and a carrier gas (He) was injected into the bubbler with a flow rate of 500 sccm in order to transport the organometallic vapors. At equilibrium, the total pressure in the reactor was maintained at 1013 mbar±50 mbar. The electrodes, covered with an alumina dielectric barrier (0.5 mm±0.1 mm), were 6 mm apart and were supplied with a 1.1 volt rms sinusoidal AC voltage at a frequency of 10 kHz.

Under these conditions, a uniform $TiO_2$ coating was deposited. The thin $TiO_2$ film thus deposited had a thickness of 260 nm and possessed photocatalytic activity. The TAS test (accurate to within 10%) gave a K of $8 \times 10^{-3}$ $cm^{-1} \cdot min^{-1}$ with a 24% peak air reduction after one hour.

Likewise, Raman analysis showed that the $TiO_2$ crystallized in rutile form.

According to a third illustrative example, a $TiO_2$ film obtained from $TiCl_4$ was deposited by a homogenous discharge operating at atmospheric pressure. The deposition conditions were identical to those of the first example, but the time was reduced so as to obtain a greater film thickness. This thin $TiO_2$ film, of 54 nm thickness deposited under the conditions of example 1, possessed photocatalytic activity. The TAS test (accurate to within 10%) gave a K of $4 \times 10^{-3}$ $cm^{-1} \cdot min^{-1}$ with a 16% peak air reduction after one hour.

Optical measurements, summarized in the table below, show that the film was not absorbent (the absorption of the bare glass being between 1.5 and 2):

| $T_L$ (%) | $T_E$ (%) | $R_L$ (%) | $A_L$ (%) | Pe | L* | a* | b* |
|---|---|---|---|---|---|---|---|
| 68.75 | 70.76 | 29.54 | 1.71 | 558 | 3.05 | 61.3 | −2.65 | 2.6 |

It should be noted that the three illustrative examples were produced without a barrier layer being interposed between the $TiO_2$ film and the substrate.

According to a fourth illustrative example, the $TiO_2$ film was deposited on a clean glass substrate heated to a temperature of 260° C. The gas mixture introduced consisted of nitrogen, ($N_2$) and oxygen ($O_2$). The nitrogen flow rate was 10 slpm, with 150 ppm of $O_2$. The organometallic precursor—titanium tetrachloride ($TiCl_4$)—was poured into a 0.5-liter bubbler. This bubbler was heated to 10° C. and a carrier gas (He) was injected into the bubbler with a flow rate of 140 sccm in order to transport the organometallic vapors. At equilibrium, the total pressure in the reactor was maintained at 1013 mbar±50 mbar. The electrodes, covered with an alumina dielectric barrier (0.5 mm±0.1 mm), were 5 mm apart and were supplied with a 1.5 volt rms sinusoidal AC voltage at a frequency of 5 kHZ. Under these conditions, a uniform $TiO_2$ film was deposited, crystallized in anatase form and having a photocatalytic activity of $11 \times 10^{-3}$ $cm^{-1} \cdot min^{-1}$, the film thickness being about 150 nm.

The invention claimed is:

1. A process for depositing, on a substrate, a coating comprising a semiconductor material comprising a metal oxide, wherein the metal oxide initiates, under radiation of a suitable wavelength, one or more radical reactions causing oxidation of organic substances and thereby said coating has photocatalytic properties, the process comprising:
depositing the coating having photocatalytic properties by chemical vapor deposition, wherein the reaction and the deposition are carried out at an atmospheric pressure and the deposition is carried out at a temperature below 300° C. under an atmosphere comprising a gas mixture that comprises at least one of an organometallic precursor and a metal halide of said metal oxide, the deposition being enhanced by a plasma source, wherein the coating having photocatalytic properties is deposited on the substrate outside a plasma discharge.

2. The process according to claim 1, wherein at least one carrier gas or a mixture of carrier gases is selected from the group consisting of air, nitrogen, helium, and argon,
and the carrier gas or the mixture of carrier gases is injected parallel to the gas mixture comprising the precursor.

3. The process according to claim 1, wherein the gas mixture comprises an oxidizing agent or a mixture of oxidizing agents.

4. The process according to claim 1, wherein the gas mixture comprises a reducing agent or a mixture of reducing agents.

5. The process according to claim 1, wherein at least one sublayer is deposited, prior to the deposition of the coating having photocatalytic properties, thereby to impart another functionality to said coating having photocatalytic properties and/or to reinforce said properties of said coating.

6. The process according to claim 1, wherein the gas mixture comprises at least one of the organometallic precursor and a metal halide of said metal oxide that is at least an amorphous or partially crystallized oxide.

7. The process according to claim 1, wherein the metal oxide is titanium oxide.

* * * * *